(12) United States Patent
Tobisawa

(10) Patent No.: US 8,865,311 B2
(45) Date of Patent: Oct. 21, 2014

(54) RESIN COMPOSITION, PREPREG, AND LAMINATE

(75) Inventor: Akihiko Tobisawa, Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 810 days.

(21) Appl. No.: 12/438,132

(22) PCT Filed: Sep. 20, 2007

(86) PCT No.: PCT/JP2007/069115
§ 371 (c)(1),
(2), (4) Date: Jul. 6, 2010

(87) PCT Pub. No.: WO2008/035815
PCT Pub. Date: Mar. 27, 2008

(65) Prior Publication Data
US 2010/0273003 A1    Oct. 28, 2010

(30) Foreign Application Priority Data

Sep. 21, 2006  (JP) ................................. 2006-255230

(51) Int. Cl.
| | | |
|---|---|---|
| *B32B 27/38* | (2006.01) |
| *B32B 15/092* | (2006.01) |
| *H05K 1/03* | (2006.01) |
| *C08G 59/32* | (2006.01) |
| *C08G 59/50* | (2006.01) |
| *C08G 59/38* | (2006.01) |
| *C08L 63/00* | (2006.01) |
| *C08J 5/24* | (2006.01) |

(52) U.S. Cl.
CPC .......... *H05K 1/0353* (2013.01); *C08G 59/3218* (2013.01); *C08G 59/5086* (2013.01); *C08G 59/38* (2013.01); *C08L 63/00* (2013.01); *H05K 2201/012* (2013.01); *C08J 2363/00* (2013.01); *C08J 5/24* (2013.01)
USPC ............................ 428/413; 428/418; 523/429

(58) Field of Classification Search
USPC ............................ 428/417, 413, 418; 523/429
See application file for complete search history.

(56) References Cited

U.S. PATENT DOCUMENTS

| 6,133,377 A | 10/2000 | Nakamura et al. |
| 6,486,242 B1 * | 11/2002 | Tobisawa et al. ............. 524/117 |
| 2005/0181215 A1 | 8/2005 | Suzuki et al. |
| 2006/0079609 A1 | 4/2006 | Nishioka et al. |

FOREIGN PATENT DOCUMENTS

| CN | 1654539 A | 8/2005 |
| CN | 1234774 C | 4/2006 |
| JP | 05-301941 | 11/1993 |
| JP | 2000-129089 | 5/2000 |
| JP | 2000-239418 | 9/2000 |
| JP | 2000-336248 | 12/2000 |
| JP | 2001-254001 | 9/2001 |
| JP | 2002-265782 | 9/2002 |
| JP | 2004-018615 | 1/2004 |
| JP | 2005-154727 | 6/2005 |
| JP | 2005-336280 | 12/2005 |
| JP | 2006-28298 | 2/2006 |
| JP | 2006-036798 | 2/2006 |

OTHER PUBLICATIONS

Horrocks, A.R.; Price, D. (2001). Fire Retardant Materials. Woodhead Publishing. p. 264-292.*
Extended European Search Report for corresponding EP Application No. 07828856.0-2210, Nov. 29, 2010.
Chinese Office Action for corresponding CN Application No. 200780032904.0, Dec. 24, 2010.
Chinese Office Action for corresponding CN Application No. 200780032904.0, Nov. 2, 2011.
Taiwanese Office Action for corresponding TW Application No. 096135330, Feb. 6, 2013.
Korean Office Action for corresponding KR Application No. 10-2009-7004577, Oct. 21, 2013.

* cited by examiner

*Primary Examiner* — Callie Shosho
*Assistant Examiner* — John Freeman
(74) *Attorney, Agent, or Firm* — Ditthavong & Steiner, P.C.

(57) ABSTRACT

A resin composition used to prepare a sheet-like prepreg by impregnating a substrate with the resin composition includes an epoxy resin that contains a naphthalene-modified epoxy resin, and a triazine-modified novolac resin. A sheet-like prepreg is formed by impregnating a substrate with the resin composition. A laminate formed using the prepreg exhibits excellent flame retardancy, solder heat resistance, and lead-free heat resistance, has a small coefficient of linear expansion in the thickness direction, and has excellent adhesion to a conductor circuit.

4 Claims, No Drawings

RESIN COMPOSITION, PREPREG, AND LAMINATE

TECHNICAL FIELD

The present invention relates to a resin composition, a prepreg, and a laminate.

BACKGROUND ART

A reduction in size of information processing equipment such as a notebook personal computer and a cellular phone has been desired. A reduction in size and weight of a laminate provided with electronic parts such as an LSI has also been desired. In order to reduce the size and weight of such a laminate, it is necessary to reduce the conductor width, through-hole diameter, and plating thickness. However, a reduction in plating thickness may cause plating cracks to occur due to a thermal shock. This may lead to a decrease in connection reliability. For this reason, a laminate is required to possess heat resistance and a small coefficient of linear expansion in the thickness direction.

In recent years, a high-melting-point solder that does not contain lead is becoming mainstream from the viewpoint of environmental regulations. Therefore, laminates are required to exhibit lead-free heat resistance to a degree not exhibiting cracking under severe conditions of about 290° C. according to the IPC T-288 test. Laminates are also required to exhibit flame retardancy.

A laminate using a naphthalene-modified epoxy resin has solder heat resistance and a small coefficient of linear expansion in the thickness direction (for example, JP-A-5-301941). On the other hand, the naphthalene-modified epoxy resin has poor adhesion to a conductor circuit metal. The naphthalene-modified epoxy resin also has poor lead-free heat resistance.

A resin composition that contains an epoxy resin containing a dicyclopentadiene-type epoxy resin and a triazine-modified novolac resin may have solder heat resistance, a small coefficient of linear expansion in the thickness direction, and adhesion to a conductor circuit metal (JP-A-2005-336280). However, such a resin composition has poor flame retardancy. Flame retardancy can be improved by increasing the nitrogen content. However, an increase in nitrogen content decreases the lead-free heat resistance. Thus, it is impossible to satisfy flame retardancy and lead-free heat resistance at the same time.

An object of the present invention is to provide a resin composition which can produce a laminate that exhibits excellent flame retardancy, solder heat resistance, and lead-free heat resistance, has a small coefficient of linear expansion in the thickness direction, and has excellent adhesion to a conductor circuit, a prepreg and a laminate using the resin composition.

DISCLOSURE OF THE INVENTION

According to the present invention, the above object can be attained by a resin composition, a prepreg, and a laminate defined in (1) to (4) given below.
(1) A resin composition used to prepare a sheet-like prepreg by impregnating a substrate with the resin composition, the resin composition comprising an epoxy resin containing naphthalene-modified epoxy resin and a triazine-modified novolac resin.
(2) The resin composition according to (1), wherein the content of the naphthalene-modified epoxy resin is 60 wt % or more, but not more than 90 wt % of the total amount of the epoxy resin.
(3) A prepreg comprising a substrate and the resin composition according to (1) or (2), the substrate being impregnated with the resin composition.
(4) A laminate comprising at least one sheet of the prepreg according to (3).

According to the present invention, a resin composition which can produce a laminate that exhibits excellent flame retardancy, solder heat resistance, and lead-free heat resistance, has a small coefficient of linear expansion in the thickness direction, and has excellent adhesion to a conductor circuit, a prepreg and a laminate using the resin composition can be provided.

BEST MODE FOR CARRYING OUT THE INVENTION

The present invention is described in detail below.

A resin composition of the present invention is used to prepare a sheet-like prepreg by impregnating a substrate with the resin composition. The resin composition comprises an epoxy resin that contains a naphthalene-modified epoxy resin and a triazine-modified novolac resin.

A prepreg of the present invention is obtained by impregnating a substrate with the above resin composition.

A laminate of the present invention is obtained by forming one or more sheets of the above prepreg.

The resin composition of the present invention will now be described.

The resin composition of the present invention contains a naphthalene-modified epoxy resin. The naphthalene-modified epoxy resin increases the flame retardancy and solder heat resistance of the laminate, and reduces the coefficient of linear expansion of the laminate. An aromatic ring such as a naphthalene ring increases the energy between molecular bonds so that decomposition due to combustion occurs to only a small extent. As a result, the resulting laminate (resin composition) exhibits flame retardancy. Therefore, the resin composition of the present invention can exhibit excellent flame retardancy without adding a known flame retardant.

There are no particular limitations to the naphthalene-modified epoxy resin used in the resin composition of the present invention. An epoxy resin having a naphthalene skeleton shown by the following formula (1), (2), or (3) may be preferably used.

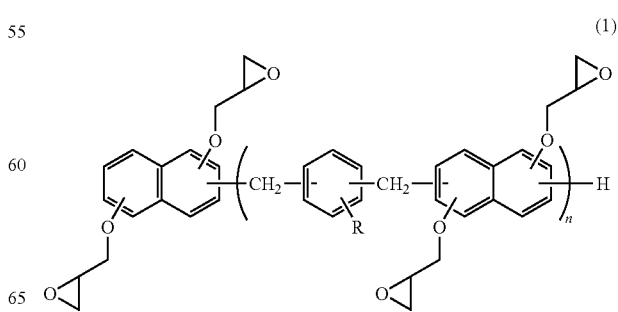

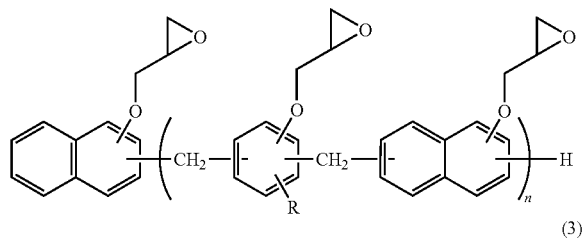

(2)

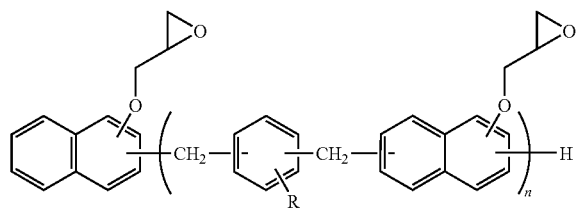

(3)

wherein n is an integer from 1 to 10, and preferably from 1 to 8, and R is a hydrogen atom or a methyl group. If n is more than 10, the resin has a high viscosity so that the substrate may not be sufficiently impregnated with the resin.

The naphthalene-modified epoxy resin shown by the formula (1) is preferable from the viewpoint of an increase in heat resistance. The naphthalene-modified epoxy resin shown by the formula (2) is preferable from the viewpoint of an increase in glass transition temperature. The naphthalene-modified epoxy resin shown by the formula (3) is preferable from the viewpoint of a reduction in water absorption.

Although not specifically limited, the content of the naphthalene-modified epoxy resin is 60 to 90 wt %, and particularly preferably 70 to 80 wt % based on the total amount of the epoxy resin. If the content of the naphthalene-modified epoxy resin is less than the above lower limit, the effect of increasing heat resistance may be impaired. If more than the above upper limit, adhesion may be impaired.

The resin composition of the present invention may contain an arbitrary epoxy resin other than the naphthalene-modified epoxy resin. For example, a bisphenol A epoxy resin, a bisphenol F epoxy resin, and the like may be used. Use of a brominated epoxy resin is preferable to ensure flame retardancy without reducing the characteristics of the naphthalene-modified epoxy resin.

The resin composition of the present invention contains a triazine-modified novolac resin. The triazine-modified novolac resin improves adhesion while maintaining heat resistance.

A novolac resin is used as a curing agent for the naphthalene-modified epoxy resin. When using a novolac resin as a curing agent for the naphthalene-modified epoxy resin, the naphthalene-modified epoxy resin maintains excellent properties such as a water absorption rate and solder heat resistance. However, a cured product obtained by curing the naphthalene-modified epoxy resin using a novolac resin has a decreased copper foil adhesion due to a low polar group content.

The resin composition of the present invention, on the other hand, is provided with adhesion and lead-free heat resistance without decreasing the water absorption rate and solder heat resistance by utilizing the triazine-modified novolac resin. The triazine-modified novolac resin increases adhesion due to nitrogen atoms contained in the molecule. The triazine-modified novolac resin does not impair the water adsorption rate. Furthermore, since the triazine ring structure has high heat resistance and high solubility in the naphthalene-modified epoxy resin, the triazine-modified novolac resin does not impair solder heat resistance. The resin composition of the present invention can provide a laminate with high adhesion and heat resistance together with low linear-expansion properties, even if the naphthalene-modified epoxy resin is used.

A triazine-modified novolac resin is obtained by reacting a phenol compound, a triazine compound, and an aldehyde compound. The triazine-modified novolac resin may contain, in addition to a condensate of a phenol compound, a triazine compound, and an aldehyde compound, a condensate of a triazine compound and an aldehyde compound, a condensate of a phenol compound and an aldehyde compound, an unreacted phenol compound, and an unreacted triazine compound. The triazine-modified novolac resin preferably has a number average molecular weight of 300 to 10,000.

As examples of the phenol compound used to prepare the triazine-modified novolac resin, a monovalent phenol compound such as phenol, naphtol, and bisphenol A; a divalent phenol compound such as resorcin and xylenol; a trivalent phenol compound such as pyrogallol and hydroxyhydroquinone; derivatives of these phenol compounds such as an alkyl derivative, a carboxyl derivative, a halogen derivative, and an amine derivative; and the like can be given. These phenol compounds may be used either individually or in combination of two or more.

As the triazine used to prepare the triazine-modified novolac resin, any compounds having a triazine ring may be used. Melamine, acetoguanamine, and benzoguanamine can be given as examples. These compounds can be used either individually or in combination of two or more.

As examples of the aldehyde compounds used to prepare the triazine-modified novolac resin, formaldehyde, acetaldehyde, benzaldehyde, hydroxyphenylaldehyde, furfural, acrolein, and the like can be given. Among these, formaldehyde is preferable due to easy handling. As the formaldehyde, formalin, paraformaldehyde, and the like can be given.

The nitrogen content of the triazine-modified novolac resin used in the present invention is preferably 8 to 20 wt %. If the nitrogen content is less than the above lower limit, adhesion is poor. If more than the above upper limit, the water absorption rate may decrease.

Although not specifically limited, the content of the triazine-modified novolac resin is preferably 20.0 to 35.0 parts by weight, and particularly preferably 24.8 to 30.0 parts by weight for 100 parts by weight of the epoxy resins. If the content of the triazine-modified novolac resin is less than the above lower limit, adhesion is poor. If more than the above upper limit, the water absorption rate may decrease. Since the cured resin can be provided with stable adhesion properties and low modulus of elasticity particularly when the content of the triazine-modified novolac resin is in the range of 24.8 to 30.0 parts by weight for 100 parts by weight of the epoxy resins, cracks are produced only with difficulty even in the case where a thermal shock is applied to the substrate.

Although the resin composition of the present invention must contain the above-described naphthalene-modified epoxy resin and triazine-modified novolac resin as essential components, the composition may further contain other resins, a curing promoter such as an imidazole compound, a coupling agent, and other components.

Next, the prepreg will be described.

The prepreg of the present invention comprises a substrate impregnated with the above resin composition. A prepreg with excellent properties such as heat resistance can be obtained by impregnating a substrate with the resin composition. As the substrate used for the prepreg of the present invention, a glass fiber substrate such as woven glass fabric and nonwoven glass fabric; an inorganic fiber substrate such as a woven or nonwoven fabric made from an inorganic compound other than glass; an organic fiber substrate made of an organic fiber such as an aromatic polyamide fiber, polyamide fiber, aromatic polyester fiber, polyester fiber, polyimide fiber, and fluororesin fiber; and the like can be given. Of these substrates, a glass fiber substrate typified by woven glass fabric is preferable from the viewpoint of strength and water absorption.

As the method for impregnating the substrate with the resin composition obtained by the present invention, a method of preparing a resin varnish by dissolving the resin composition in a solvent and immersing the substrate in the varnish, a method of coating the substrate with the resin varnish using various coating apparatuses, a method of spraying the resin varnish to the substrate using a spraying apparatus, and the like can be given. Of these, the method of immersing the substrate in the varnish is preferable. Immersion of the substrate in the varnish can improve impregnation of the resin composition in the substrate. When immersing the substrate in the varnish, a general impregnation-coating apparatus may be used.

A solvent in which the resin composition exhibits good solubility is preferably used to prepare the resin varnish, but a poor solvent may be used to the extent that the solvent exhibits no adverse effect. As examples of the solvent in which the resin composition has good solubility, methyl ethyl ketone, cyclohexanone, and the like can be given.

Although not specifically limited, the content of the solid components of the resin varnish is preferably from 40 to 80 wt %, and particularly preferably from 50 to 65 wt %. The content of the solid components in this range further improves impregnation of the resin varnish in the substrate. The prepreg can be obtained by impregnating the substrate with the resin composition and drying the substrate at a temperature of 80 to 200° C., for example.

Next, the laminate will be described.

The laminate of the present invention includes one or more sheets of the above prepreg. Therefore, a laminate having excellent heat resistance, a small coefficient of linear expansion in the thickness direction, and excellent adhesion can be obtained. When one sheet of prepreg is used, a metal foil or film is layered on one or both sides of the sheet. It is possible to laminate two or more sheets of prepreg. In this case, a metal foil or film is layered on one or both of the outermost sides of the prepreg laminate. The prepreg on which a metal foil or the like has been layered is formed by heat-pressing to obtain a laminate.

Although there are no particular limitations, the laminate is formed at a temperature of preferably 120 to 220° C., and particularly preferably at 150 to 200° C., under a pressure of preferably 2 to 5 MPa, and particularly preferably 2.5 to 4 MPa.

EXAMPLES

The present invention will be explained by examples and comparative examples which are not intended to be limiting of the present invention.

Example 1

(1) Preparation of Resin Varnish

A resin varnish with a concentration of nonvolatile components of 55 wt % was prepared by adding methyl ethyl ketone to a mixture of 75.5 parts by weight of a naphthalene-modified epoxy resin (epoxy equivalent: 230, NC-7000L manufactured by Nippon Kayaku Co., Ltd.), 24.5 parts by weight of a brominated bisphenol A epoxy resin (epoxy equivalent: 400, #153, manufactured by Dainippon Ink and Chemicals, Inc.), 28.2 parts by weight of a triazine-modified novolac resin (hydroxyl equivalent: 145, nitrogen content: 19 wt %, KA-1356 manufactured by Dainippon Ink and Chemicals, Inc.), and 0.1 part by weight of 2-methylimidazole.

(2) Preparation of Prepreg

A woven glass fabric (thickness: 0.18 mm, manufactured by Nitto Boseki Co., Ltd.) was impregnated with the above resin varnish in an amount of 80 parts by weight of the resin varnish solid component per 100 parts by weight of the woven glass fabric, and dried in a drying furnace at 150° C. for five minutes to obtain a prepreg with a resin content of 44.4 wt %.

(3) Preparation of Laminate

Six sheets of prepreg were laminated. The both upper and lower sides of the laminate were clad with an electrolysis copper foil with a thickness of 35 µm and heat-pressed under a pressure of 4 MPa at a temperature of 200° C. for 150 minutes to obtain a double-sided copper-clad laminate with a thickness of 1.2 mm.

Example 2

A resin varnish, a prepreg, and a laminate were prepared in the same manner as in Example 1, except for using 75.5 parts by weight of a naphthalene-modified epoxy resin (epoxy equivalent: 175, ESN-175 manufactured by Nippon Steel Chemical Co., Ltd.), 24.5 parts by weight of a brominated bisphenol A epoxy resin (epoxy equivalent: 400, #153, manufactured by Dainippon Ink and Chemicals, Inc.), 28.5 parts by weight of a triazine-modified novolac resin (hydroxyl equivalent: 145, nitrogen content: 19 wt %, KA-1356 manufactured by Dainippon Ink and Chemicals, Inc.), and 0.1 part by weight of 2-methylimidazole.

Example 3

A resin varnish, a prepreg, and a laminate were prepared in the same manner as in Example 1, except for using 75.5 parts by weight of a naphthalene-modified epoxy resin (epoxy equivalent: 270, ESN-175 manufactured by Nippon Steel Chemical Co., Ltd.), 24.5 parts by weight of a brominated bisphenol A epoxy resin (epoxy equivalent: 400, #153, manufactured by Dainippon Ink and Chemicals, Inc.), 24.7 parts by weight of a triazine-modified novolac resin (hydroxyl equivalent: 145, nitrogen content: 19 wt %, KA-1356 manufactured by Dainippon Ink and Chemicals, Inc.), and 0.1 part by weight of 2-methylimidazole.

Example 4

A resin varnish, a prepreg, and a laminate were prepared in the same manner as in Example 1, except for using KA-7054 (hydroxyl equivalent: 125, nitrogen content: 12 wt %, manufactured by Dainippon Ink and Chemicals, Inc.) as a triazine-modified novolac resin and changing the amounts of the components as shown in Table 1.

Comparative Example 1

A resin varnish, a prepreg, and a laminate were prepared in the same manner as in Example 1, except for using phenol novolac as a curing agent without using a triazine-modified novolac resin and changing the amounts of the components as shown in Table 1.

Comparative Example 2

A resin varnish, a prepreg, and a laminate were prepared in the same manner as in Example 1, except for using a cresol novolak epoxy resin as an epoxy resin instead of the naphthalene-modified epoxy resin and changing the amounts of the components as shown in Table 1.

Comparative Example 3

A resin varnish, a prepreg, and a laminate were prepared in the same manner as in Example 1, except for using dicyandiamide and 4,4-diaminodiphenylsulfone as a curing agent without using a triazine-modified novolac resin and changing the amounts of the components as shown in Table 1.

Comparative Example 4

A resin varnish, a prepreg, and a laminate were prepared in the same manner as in Example 1, except for using a dicyclopentadiene epoxy resin as an epoxy resin instead of the naphthalene-modified epoxy resin and changing the amounts of the components as shown in Table 1.

The laminates obtained in the Examples and Comparative Examples were evaluated. The items and methods of evaluation are given below. The results are shown in Table 1.

TABLE 1

| | | Example 1 | Example 2 | Example 3 | Example 4 |
|---|---|---|---|---|---|
| Amount (parts by weight) | Naphthalene-modified epoxy resin 1) | 75.5 | | | 75.5 |
| | Naphthalene-modified epoxy resin 2) | | 75.5 | | |
| | Naphthalene-modified epoxy resin 3) | | | 75.5 | |
| | Brominated bisphenol A epoxy resin 4) | 24.5 | 24.5 | 24.5 | 24.5 |
| | Triazine-modified novolac resin 5) | 28.2 | 28.5 | 24.9 | |
| | Triazine-modified novolac resin 6) | | | | 24.3 |
| | 2-Methylimidazole | 0.1 | 0.1 | 0.1 | 0.1 |
| Properties | Glass transition temperature (° C.) | 191 | 202 | 185 | 197 |
| | Coefficient of linear expansion in thickness direction (ppm) | 42 | 45 | 43 | 42 |
| | Solder heat resistance | No abnormalities | No abnormalities | No abnormalities | No abnormalities |
| | Lead-free heat resistance | 30 minutes or more | 30 minutes or more | 30 minutes or more | 30 minutes or more |
| | Flame retardancy | 94V-0 | 94V-0 | 94V-0 | 94V-0 |
| | Peel strength (kN/m) | 1.4 | 1.3 | 1.4 | 1.3 |

| | | Comparative Example 1 | Comparative Example 2 | Comparative Example 3 | Comparative Example 4 |
|---|---|---|---|---|---|
| Amount (parts by weight) | Naphthalene-modified epoxy resin 1) | 75.5 | | 72.4 | |
| | Brominated bisphenol A epoxy resin 4) | 24.5 | 29.5 | 27.6 | 24.5 |
| | Cresol novolak epoxy resin 7) | | 70.5 | | |
| | Triazine-modified novolac resin 5) | | 20.8 | | 17.3 |
| | Dicyclopentadiene epoxy resin 9) | | | | 75.5 |
| | Dicyandiamide | | | 3.4 | |
| | 4,4-diaminodiphenylsulfone | | | 3.6 | |
| | Phenol novolac resin 8) | 24.5 | | | |
| | 2-Methylimidazole | 0.1 | 0.1 | 0.2 | 0.1 |
| Properties | Glass transition temperature (° C.) | 190 | 196 | 206 | 191 |
| | Coefficient of linear expansion in thickness direction (ppm) | 42 | 56 | 38 | 42 |
| | Solder heat resistance | No abnormalities | No abnormalities | No abnormalities | No abnormalities |
| | Lead-free heat resistance | 30 minutes or more | 30 minutes or more | 11 minutes | 30 minutes or more |
| | Flame retardancy | 94V-0 | 94V-0 | 94V-0 | 94V-1 |
| | Peel strength (kN/m) | 0.7 | 1.3 | 1.6 | 1.4 |

1. Raw Material
(1) Naphthalene-modified epoxy resin of the formula (2) (epoxy equivalent: 230, NC-7000L manufactured by Nippon Kayaku Co., Ltd.)
(2) Naphthalene-modified epoxy resin of the formula (1) (epoxy equivalent: 175, ESN-375 manufactured by Nippon Steel Chemical Co., Ltd.)
(3) Naphthalene-modified epoxy resin of the formula (3) (epoxy equivalent: 270, ESN-175 manufactured by Nippon Steel Chemical Co., Ltd.)
(4) Brominated bisphenol A epoxy resin (epoxy equivalent: 400, bromination rate: 49%, #153, manufactured by Dainippon Ink and Chemicals, Inc.)
(5) Triazine-modified novolac resin (hydroxyl equivalent: 145, nitrogen content: 19 wt %, KA-1356 manufactured by Dainippon Ink and Chemicals, Inc.)
(6) Triazine-modified novolac resin (hydroxyl equivalent: 125, nitrogen content: 12 wt %, KA-7054 manufactured by Dainippon Ink and Chemicals, Inc.)
(7) Cresol novolak epoxy resin (epoxy equivalent: 210, N-690, manufactured by Dainippon Ink and Chemicals, Inc.)
(8) Phenol novolac resin (hydroxyl equivalent: 105, PR-51470 manufactured by Sumitomo Bakelite Co., Ltd.)
(9) Dicyclopentadiene epoxy resin (epoxy equivalent: 270, HP-7200H manufactured by Dainippon Ink and Chemicals, Inc.)

2. Evaluation Method
(1) Glass Transition Temperature
The glass transition temperature was determined from the tan δ peak temperature by the viscoelasticity method
(2) Coefficient of Linear Expansion in the Thickness Direction
The coefficient of linear expansion in the thickness direction was measured by TMA (thermomechanical analysis) and indicated by the average value of 50 to 150° C.
(3) Solder Heat Resistance
The solder heat resistance was measured according to JIS C6481. The sample was allowed to absorb moisture in boiling water for two hours, and immersed in a solder bath at 260° C. for 120 seconds to determine the presence or absence of abnormalities in external appearance.
(4) Peel Strength
The peel strength was measured according to JIS C6481.
(5) Flame Retardancy
The flame retardancy was measured according to the UL vertical method by judging if the flammability is 94V-0 or 94V-1 according to the time elapsed before fire extinguishing. 94V-0 indicates that the flame retardancy of the sample is excellent, and 94V-1 indicates that the flame retardancy of the sample is inferior to the sample rated as 94V-0.
(6) Lead-Free Heat Resistance
The lead-free heat resistance was measured according to the IPC-TM-650 T-288 test. Specifically, the sample was maintained at 288° C. in TMA (thermomechanical analysis), and the period of time required for the layers of the laminate to delaminate was measured.

As can be seen from Table 1, the laminates of Examples 1 to 4 prepared using the resin compositions of the present invention containing an epoxy resin containing a naphthalene-modified epoxy resin and a triazine-modified novolac resin exhibited excellent flame retardancy, solder heat resistance, lead-free heat resistance, coefficient of linear expansion in the thickness direction, and adhesion.

In contrast, the laminate of Comparative Example 1 in which only phenol novolak was used as a curing agent showed poor adhesion. The laminate of Comparative Example 1 exhibited no adverse effect on lead-free heat resistance, because the composition did not contain a nitrogen compound. The laminate of Comparative Example 2 in which naphthalene modified epoxy resin was not used showed an unfavorable result in the value of coefficient of linear expansion in the thickness direction.

The laminate of Comparative Example 3 in which dicyandiamide and 4,4-diaminodiphenylsulfone were used as curing agents showed excellent flame retardancy, but its lead-free resistance was poor. The laminate of Comparative Example 4 in which a naphthalene modified epoxy resin was not used showed poor flame retardancy.

INDUSTRIAL APPLICABILITY

The laminate of the present invention is useful as a circuit board for information processing equipment such as a notebook personal computer and a cellular phone. In particular, the laminate can be reduced in size and weight, and exhibits high thermal shock resistance and heat resistance. The resin composition and the prepreg of the present invention are useful for preparing such a laminate.

The invention claimed is:
1. A resin composition used to prepare a prepreg by impregnating a substrate with the resin composition, the resin composition consisting essentially of an epoxy resin that contains a naphthalene-modified epoxy resin and a brominated bisphenol A epoxy resin; and a triazine-modified novolac resin, the content of the naphthalene-modified epoxy resin being 60 to 90 wt % of the total amount of the epoxy resin, and the content of the triazine-modified novolac resin being 24.3 to 30.0 parts by weight based on 100 parts by weight of the epoxy resin.
2. The resin composition according to claim 1, wherein the content of the naphthalene-modified epoxy resin is 70 wt % or more, but not more than 90 wt % based on the total amount of the epoxy resin.
3. A prepreg comprising a substrate and the resin composition according to claim 1 or 2, the substrate being impregnated with the resin composition.
4. A laminate comprising at least one sheet of the prepreg according to claim 3.

* * * * *